United States Patent
Yang et al.

(10) Patent No.: US 12,313,670 B2
(45) Date of Patent: May 27, 2025

(54) PRODUCT LINE TESTING METHOD AND SYSTEM

(71) Applicant: Luxsan Technology (Kunshan) Co., Ltd., Jiangsu (CN)

(72) Inventors: Junfeng Yang, Kunshan (CN); Wanping Li, Kunshan (CN); Jun Xiong, Kunshan (CN); Jincheng Liu, Kunshan (CN); Yudong Zhou, Kunshan (CN)

(73) Assignee: Luxsan Technology (Kunshan) Co., Ltd., Jiangsu (CN)

( * ) Notice: Subject to any disclaimer, the term of this patent is extended or adjusted under 35 U.S.C. 154(b) by 163 days.

(21) Appl. No.: 18/110,647

(22) Filed: Feb. 16, 2023

(65) Prior Publication Data
US 2024/0103064 A1    Mar. 28, 2024

(30) Foreign Application Priority Data

Sep. 26, 2022   (CN) .......................... 202211169826.1

(51) Int. Cl.
*G01R 31/28* (2006.01)
(52) U.S. Cl.
CPC ................................ *G01R 31/2806* (2013.01)
(58) Field of Classification Search
CPC ............ G01R 31/2806; G01R 31/2894; G01R 31/2834; G06Q 10/0639; G06Q 10/103; G06Q 50/04; H04M 1/24
See application file for complete search history.

(56) References Cited

U.S. PATENT DOCUMENTS

| | | | |
|---|---|---|---|
| 8,700,030 B1* | 4/2014 | Cole ....................... | H04M 1/24 |
| | | | 455/425 |
| 2006/0052966 A1 | 3/2006 | Mosher | |
| 2011/0035179 A1* | 2/2011 | Tao ........................ | G06F 11/006 |
| | | | 707/600 |
| 2013/0054170 A1* | 2/2013 | Sobajic ............... | G06F 11/2733 |
| | | | 702/82 |

(Continued)

FOREIGN PATENT DOCUMENTS

| | | |
|---|---|---|
| CN | 104244312 B | 10/2017 |
| CN | 111464685 A | 7/2020 |

(Continued)

OTHER PUBLICATIONS

First Search Report for CN 202211169826.1, dated Nov. 9, 2022.
Office Action issued for CN 202211169826.1, dated Nov. 15, 2022.

*Primary Examiner* — Akm Zakaria
(74) *Attorney, Agent, or Firm* — Birch, Stewart, Kolasch & Birch, LLP

(57) ABSTRACT

A product line testing method includes acquiring identity information of at least one to-be-tested product and identity information of a current testing station; acquiring target testing station information of the at least one to-be-tested product according to the identity information of the at least one to-be-tested product; and comparing the target testing station information with the identity information of the current testing station to generate a comparison result and, according to the comparison result, executing the testing flow of the current testing station or outputting testing prompt information. The technical solutions improve the efficiency of product testing.

10 Claims, 7 Drawing Sheets

(56) References Cited

U.S. PATENT DOCUMENTS

| | | | | |
|---|---|---|---|---|
| 2016/0044520 | A1* | 2/2016 | Iyer | H04W 24/08 |
| | | | | 370/252 |
| 2019/0335033 | A1* | 10/2019 | Huang | G06Q 10/30 |
| 2021/0247443 | A1* | 8/2021 | Yin | B65G 43/10 |
| 2023/0409309 | A1* | 12/2023 | Hou | G06F 11/368 |

FOREIGN PATENT DOCUMENTS

| | | | |
|---|---|---|---|
| CN | 111681915 A | 9/2020 | |
| CN | 111736064 A | 10/2020 | |
| CN | 113469648 A | 10/2021 | |
| TW | 202107105 A | 2/2021 | |

* cited by examiner

PRODUCT LINE TESTING METHOD AND SYSTEM

CROSS-REFERENCE TO RELATED APPLICATION(S)

This application claims priority to Chinese Patent Application No. 202211169826.1 filed Sep. 26, 2022, the disclosure of which is incorporated herein by reference in its entirety.

TECHNICAL FIELD

The present invention relates to the technical field of product testing and, in particular, to a product line testing method and system.

BACKGROUND

With the development of science and technology, existing smart terminals such as smartphones are more and more widely applied. Existing electronic products such as smartphones need to be tested before leaving the factory. An existing testing method has a complex testing flow and a long time-consuming process and affects the testing efficiency.

The testing process of a to-be-tested electronic product such as a mobile phone mainboard passes through N testing stations in sequence: from testing station A to testing station B, from testing station B to testing station C, and from testing station C to testing station D, . . . .

The testing station A writes some test values into the mobile phone mainboard and uploads the test values to a server. These test values are used at the later testing station D. If the mobile phone mainboard skips the testing station A directly to the testing station D, the mobile phone mainboard misses the test values requiring to be recorded by the testing station A at the testing station D. The mobile phone mainboard missing the test values of the testing station A causes testing failure of the testing station D when the mobile phone mainboard is tested at the testing station D. Testers need to return the mobile phone mainboard to the testing station A to retest. Once a testing station in the middle is skipped, this mobile phone mainboard is delayed for at least 45 minutes, causing waste of labor and working hours and low testing efficiency of existing products.

SUMMARY

The present invention provides a product line testing method and system to solve the problem of low testing efficiency of existing products.

According to a first aspect of the present invention, a product line testing method is provided. The method includes acquiring identity information of at least one to-be-tested product and identity information of a current testing station; acquiring target testing station information of the at least one to-be-tested product according to the identity information of the at least one to-be-tested product; and comparing the target testing station information with the identity information of the current testing station to generate a comparison result and, according to the comparison result, executing the testing flow of the current testing station or outputting testing prompt information.

Optionally, executing the testing flow of the current testing station includes sending a testing request; performing a testing operation according to the testing request; acquiring a testing result; and updating target testing station information.

Optionally, performing the testing operation according to the testing request includes controlling a test fixture to press down so that the test fixture acts on the at least one to-be-tested product and executing a testing program on the at least one to-be-tested product.

Optionally, acquiring the identity information of the at least one to-be-tested product and the identity information of the current testing station includes acquiring identity information of at least two to-be-tested products and acquiring the identity information of the current testing station.

Optionally, after acquiring the identity information of the at least two to-be-tested products, the method also includes acquiring model information of each to-be-tested product according to the identity information of the at least two to-be-tested products.

Optionally, after acquiring the model information of the each to-be-tested product according to the identity information of the at least two to-be-tested products, the method also includes comparing the model information of the each to-be-tested product to generate a comparison result.

Optionally, the comparison result includes the model information of the each to-be-tested product being the same or different.

Optionally, according to the comparison result, executing the testing flow of the current testing station or outputting the testing prompt information includes, when the model information of the each to-be-tested product is the same and the target testing station information matches the identity information of the current testing station, executing the testing flow of the current testing station; when the model information of the each to-be-tested product is the same and the target testing station information does not match the identity information of the current testing station, determining and outputting testing prompt information of each target testing station; and when the model information of the to-be-tested products is different, determining and outputting testing prompt information that the to-be-tested products cannot be simultaneously tested.

Optionally, after executing the testing flow of the current testing station according to the comparison result, the method also includes writing a test value into the at least two to-be-tested products when an Ath testing station tests the at least two to-be-tested products, reading the test value by an Mth testing station, comparing the test value with a preset value, determining the cause of testing failure of the Mth testing station according to a comparison result, and returning the at least two to-be-tested products to the Ath testing station.

According to a second aspect of the present invention, a product line testing system is provided. The product line testing system includes a processor, and a storage device for storing computer executable instructions that when executed by the processor cause the processor to perform: acquiring identity information of at least one to-be-tested product and identity information of a current testing station; acquiring target testing station information of the at least one to-be-tested product according to the identity information of the at least one to-be-tested product; and comparing the target testing station information with the identity information of the current testing station to generate a comparison result and, according to the comparison result, executing a testing flow of the current testing station or outputting testing prompt information.

According to the comparison result, executing the testing flow of the current testing station includes: determining, according to the comparison result, whether to perform testing at the current testing station; executing the testing flow of the current testing station if the testing is performed at the current testing station; and updating target testing station information of the at least one to-be-tested product when the testing is finished at the current testing station; and when the at least one to-be-tested product enters a next testing station to test, taking updated target testing station information as the target testing station information.

Optionally, executing the testing flow of the current testing station includes: sending a testing request, performing a testing operation according to the testing request, acquiring a testing result, and updating target testing station information.

Optionally, performing the testing operation according to the testing request includes: controlling a test fixture to press down so that the test fixture acts on the at least one to-be-tested product; and executing a testing program on the at least one to-be-tested product.

Optionally, acquiring the identity information of the at least one to-be-tested product and the identity information of the current testing station includes: acquiring identity information of at least two to-be-tested products; and acquiring the identity information of the current testing station.

Optionally, after acquiring the identity information of the at least two to-be-tested products, the product line testing method further includes: acquiring model information of each of the at least two to-be-tested products according to the identity information of the at least two to-be-tested products.

Optionally, after acquiring the model information of the each of the at least two to-be-tested products according to the identity information of the at least two to-be-tested products, the product line testing method further includes: comparing the model information of the at least two to-be-tested products to generate a comparison result.

Optionally, wherein the comparison result includes: the model information of the at least two to-be-tested products being same or different.

Optionally, wherein according to the comparison result, executing the testing flow of the current testing station or outputting the testing prompt information includes: when the model information of the at least two to-be-tested products is same and the target testing station information matches the identity information of the current testing station, executing the testing flow of the current testing station; when the model information of the at least two to-be-tested products is same and the target testing station information does not match the identity information of the current testing station, determining and outputting testing prompt information of each target testing station; and when the model information of the at least two to-be-tested products is different, determining and outputting testing prompt information that the at least two to-be-tested products cannot be simultaneously tested.

Optionally, after according to the comparison result, executing the testing flow of the current testing station, the product line testing method further includes: writing a test value into the at least two to-be-tested products when an Ath testing station tests the at least two to-be-tested products; and reading the test value by an Mth testing station, comparing the test value with a preset value, determining a cause of testing failure of the Mth testing station according to a comparison result, and returning the at least two to-be-tested products to the Ath testing station.

According to a third aspect of the present invention, a non-transitory computer-readable storage medium is provided. The non-transitory computer-readable storage medium stores computer instructions for causing a computer to perform: acquiring identity information of at least one to-be-tested product and identity information of a current testing station; acquiring target testing station information of the at least one to-be-tested product according to the identity information of the at least one to-be-tested product; and comparing the target testing station information with the identity information of the current testing station to generate a comparison result and, according to the comparison result, executing a testing flow of the current testing station or outputting testing prompt information.

According to the comparison result, executing the testing flow of the current testing station includes: determining, according to the comparison result, whether to perform testing at the current testing station; executing the testing flow of the current testing station if the testing is performed at the current testing station; and updating target testing station information of the at least one to-be-tested product when the testing is finished at the current testing station; and when the at least one to-be-tested product enters a next testing station to test, taking updated target testing station information as the target testing station information.

Optionally, executing the testing flow of the current testing station includes: sending a testing request, performing a testing operation according to the testing request, acquiring a testing result, and updating target testing station information.

BRIEF DESCRIPTION OF DRAWINGS

The drawings used in description of the embodiments are described below. Apparently, the drawings described below merely illustrate part of embodiments of the present invention, and those skilled in the art may obtain other drawings based on the drawings described below on the premise that no creative work is done.

DETAILED DESCRIPTION

The technical solutions in embodiments of the present invention are described clearly and completely in conjunction with the drawings in embodiments of the present invention. Apparently, the embodiments described below are part, not all, of the embodiments of the present invention. Based on the embodiments described herein, all other embodiments obtained by those skilled in the art on the premise that no creative work is done are within the scope of the present invention.

It is to be noted that the terms "first", "second", and the like in the description, claims and drawings of the present invention are used for distinguishing between similar objects and are not necessarily used for describing a particular order or sequence. It is to be understood that the data used in this way is interchangeable where appropriate so that the embodiments of the present invention described herein may also be implemented in a sequence not illustrated or described herein. In addition, the terms "including", "having", or any other variations thereof described herein are intended to encompass a non-exclusive inclusion. For example, a process, method, system, product, or device that includes a series of steps or units may include not only the expressly listed steps or units but also other steps or units that are not expressly listed or are inherent to such a process, method, system, product or device.

Figure 1:
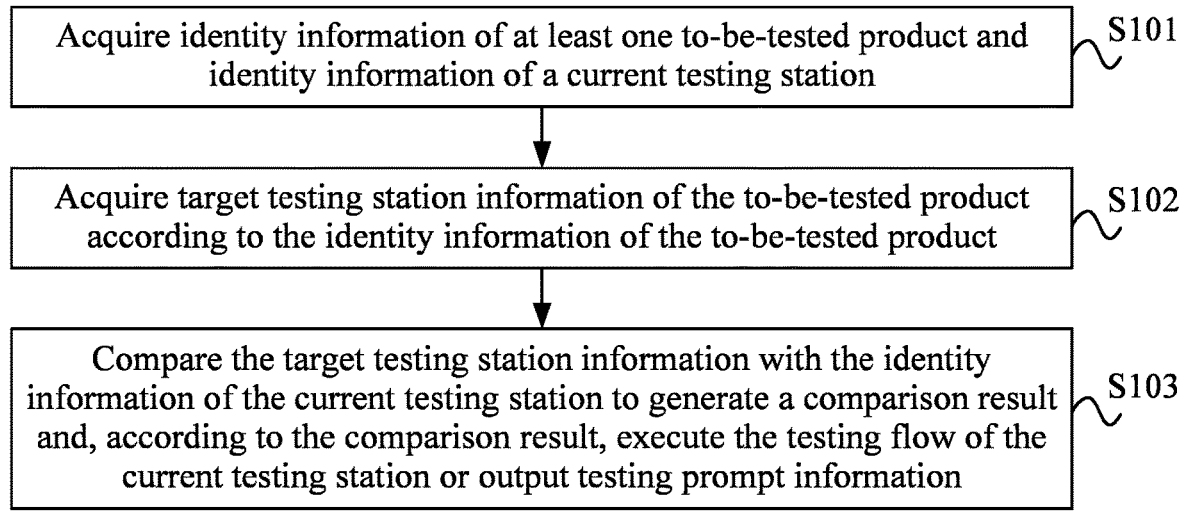
FIG. 1 is a flowchart of a product line testing method according to an embodiment of the present invention.

FIG. 1 is a flowchart of a product line testing method according to an embodiment of the present invention. Referring to FIG. 1, the product line testing method provided in this embodiment of the present invention includes steps described below.

In S101, identity information of at least one to-be-tested product and identity information of a current testing station are acquired.

Specifically, to-be-tested products may include devices such as mainboards of terminal devices such as mobile phones, tablet computers, and wearable devices. The identity information of a to-be-tested product may be embodied by a serial number. The identity information of the to-be-tested product can be acquired by scanning the serial number of the to-be-tested product with a scanning gun. The identity information of the current testing station can be acquired by scanning the ID of the testing station with the scanning gun to acquire the identity information of the current testing station. The identity information of the to-be-tested product obtained by the scanning of the scanning gun and the identity information of the current testing station obtained by the scanning of the scanning gun are output to a central processing unit. The central processing unit receives the identity information of the to-be-tested product and the identity information of the current testing station.

It is to be noted that one or more to-be-tested products can be tested at a time on a product testing line. Exemplarily, multiple to-be-tested products may be tested by using the same test fixture. For example, 4 or 6 to-be-tested products are tested at the same time by using the same test fixture.

In S102, target testing station information of the to-be-tested product is acquired according to the identity information of the to-be-tested product.

Specifically, the target testing station information of the to-be-tested product can be acquired from a cloud system according to the identity information of the to-be-tested product. The target testing station information may include information of a name, a location, a test item, and the like of the testing station where the to-be-tested product needs to be tested.

In S103, the target testing station information is compared with the identity information of the current testing station to generate a comparison result. According to the comparison result, the testing flow of the current testing station is executed, or testing prompt information is output.

According to the comparison result, the testing flow of the current testing station is executed including determining, according to the comparison result, whether to perform testing at the current testing station; executing the testing flow of the current testing station if the testing is performed at the current testing station; and updating target testing station information of the to-be-tested product when the testing is finished at the current testing station; and when the to-be-tested product enters a next testing station to test, taking the updated target testing station information as the target testing station information.

Specifically, a central controller can compare the target testing station information with the identity information of the current testing station and determine, according to the comparison result, whether to perform testing at the current testing station. If testing is performed at the current testing station, the testing flow of the current testing station is executed. When the testing at the current testing station is completed, the testing result is uploaded to the cloud system, and the target testing station information of the to-be-tested product is updated. When the to-be-tested product enters a next testing station to test, the updated target testing station information is read from the cloud system. The updated target testing station information includes the testing result of the previous testing station and the updated target testing station information of the to-be-tested product. Alternatively, according to the comparison result, if the testing is not performed at the current testing station, the testing prompt information is output.

The target testing station information is the testing station information to which a test pointer points. The current testing station is jumped to the next testing station. After the testing of the target testing station information at the current testing station is completed, the testing station to which the test pointer points updates the target testing station information of the current testing station to the target testing station information of the next testing station. In this manner, the automatic station jumping of the to-be-tested product is implemented without manual intervention, further improving the testing efficiency.

Exemplarily, the to-be-tested product needs to pass from testing station A to testing station B, from testing station B to testing station C, and from testing station C to testing station D, . . . . When the current testing station is testing station B, if the test pointer points to testing station B, the target testing station information is the information of testing station B. This indicates that the current testing station information is the same as the target testing station information. The testing flow of testing station B is executed. When the testing at testing station B is completed, the test pointer jumps to the next testing station, that is, testing station C, and the target testing station information of the to-be-tested product is updated to the information tested at testing station C. When the to-be-tested product enters testing station C to test, the updated target testing station information, that is, the information tested at testing station C, is taken as the target testing station information.

If the test pointer points to another testing station other than testing station B, the target testing station information is information other than the information of testing station B. This indicates that the current testing station information is different from the target testing station information. Testing prompt information is output to inform that testing at the current testing station is not allowed.

The testing prompt information of the target testing station may be output when the target testing station information does not match the identity information of the current testing station. The testing prompt information of the current testing station may be output when the target testing station information matches the identity information of the current testing station. The testing prompt information is convenient for testers to determine the testing flow and link of the to-be-tested product in time.

According to the product line testing method provided in this embodiment, the identity information of the at least one to-be-tested product and the identity information of the current testing station are acquired; the target testing station information of the to-be-tested product is acquired according to the identity information of the to-be-tested product; and the target testing station information is compared with the identity information of the current testing station to generate a comparison result and, according to the comparison result, the testing flow of the current testing station is executed or testing prompt information is output. According to the comparison result, the testing flow of the current testing station is executed so that the accuracy of testing is improved. By outputting the testing prompt information, it is convenient to monitor the test status of the test fixture in real time and improve the testing efficiency of the to-be-tested product.

Figure 2:
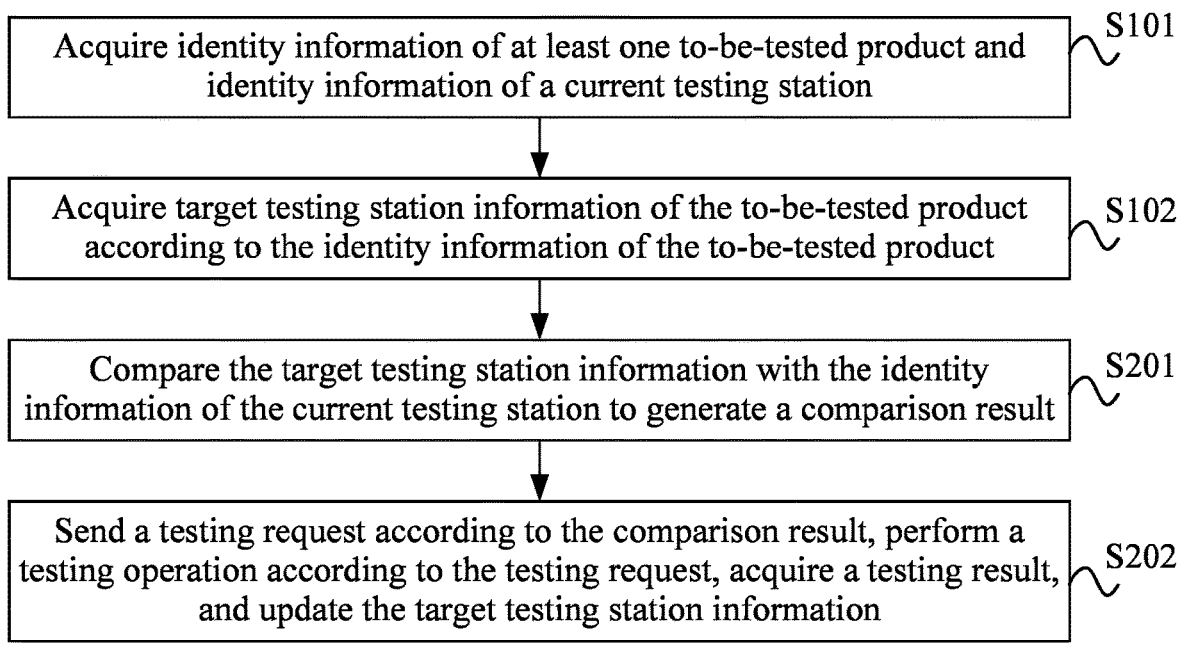
FIG. 2 is a flowchart of another product line testing method according to an embodiment of the present invention.

Optionally, FIG. 2 is a flowchart of another product line testing method according to an embodiment of the present invention. Referring to FIG. 2, the product line testing method provided in this embodiment of the present invention includes steps described below.

In S101, identity information of at least one to-be-tested product and identity information of a current testing station are acquired.

In S102, target testing station information of the to-be-tested product is acquired according to the identity information of the to-be-tested product.

In S201, the target testing station information is compared with the identity information of the current testing station to generate a comparison result.

Specifically, for example, the identity information of the target testing station information may be compared with the identity information of the current testing station to generate a comparison result.

In S202, a testing request is sent according to the comparison result; a testing operation is performed according to the testing request; a testing result is acquired; and the target testing station information is updated.

Specifically, when the comparison result is that the model information of each to-be-tested product is the same, the testing request is sent. A testing device performs the testing operation according to the testing request. After the testing, the testing result is acquired, and the target testing station information is updated.

Figure 3:
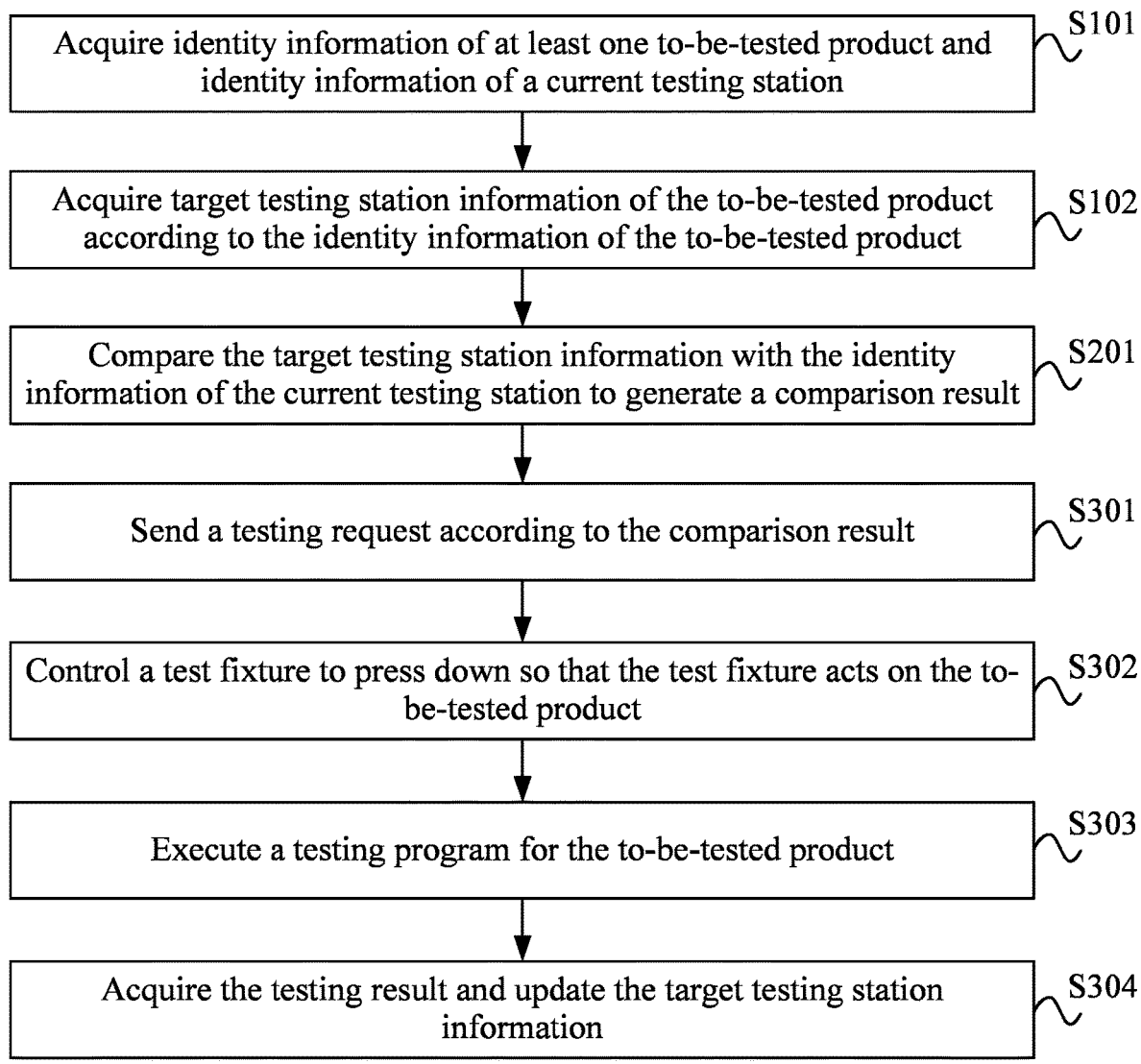
FIG. 3 is a flowchart of another product line testing method according to an embodiment of the present invention.

Optionally, FIG. 3 is a flowchart of another product line testing method according to an embodiment of the present invention. Referring to FIG. 3, the product line testing method provided in this embodiment of the present invention includes steps described below.

In S101, identity information of at least one to-be-tested product and identity information of a current testing station are acquired.

In S102, target testing station information of the to-be-tested product is acquired according to the identity information of the to-be-tested product.

In S201, the target testing station information is compared with the identity information of the current testing station to generate a comparison result.

In S301, a testing request is sent according to the comparison result.

In S302, a test fixture is controlled to press down so that the test fixture acts on the to-be-tested product.

Specifically, a testing device controls the test fixture to press down according to the testing request so that the test fixture acts on the to-be-tested product.

In S303, a testing program is executed for the to-be-tested product.

Specifically, the testing program is executed for the to-be-tested product configured on the fixture, the testing is performed, and a testing result is generated.

In S304, the testing result is acquired, and the target testing station information is updated.

Specifically, the testing result is uploaded to a cloud system. The target testing station information stored in the cloud system is updated.

Figure 4:
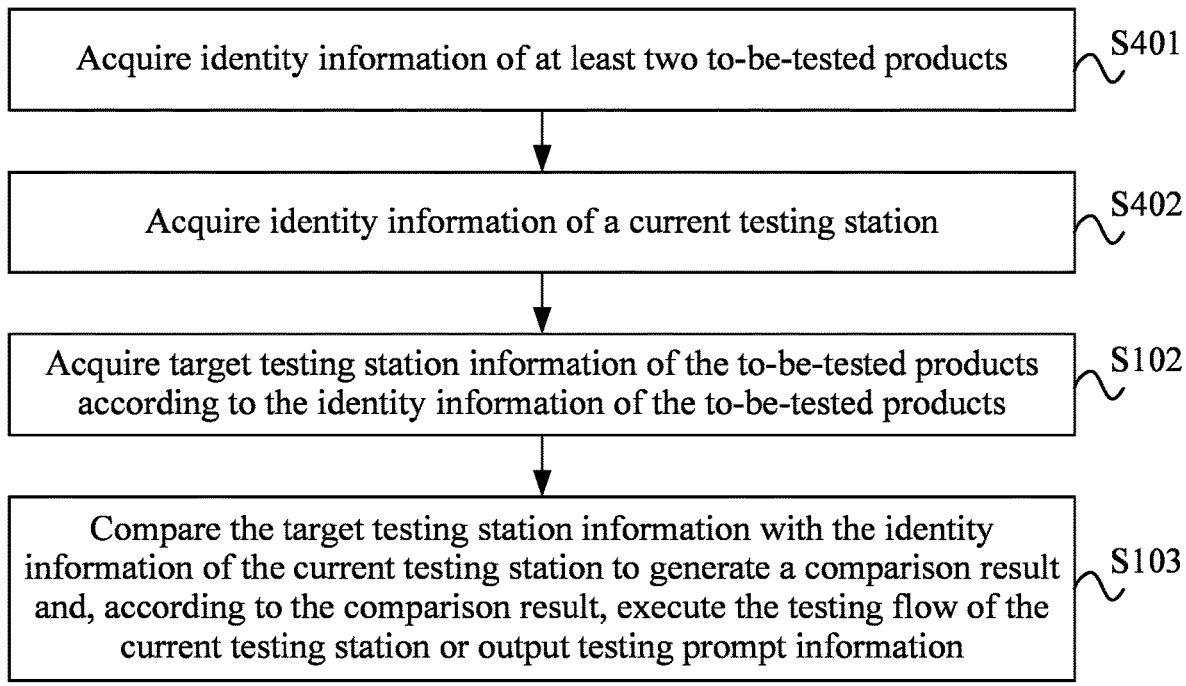
FIG. 4 is a flowchart of another product line testing method according to an embodiment of the present invention.

Optionally, FIG. 4 is a flowchart of another product line testing method according to an embodiment of the present invention. Referring to FIG. 4, the product line testing method provided in this embodiment of the present invention includes steps described below.

In S401, identity information of at least two to-be-tested products is acquired.

Specifically, when multiple to-be-tested products are tested on the same test fixture, identity information of each to-be-tested product can be acquired.

In S402, the identity information of the current testing station is acquired.

Specifically, the identity information of the current testing station on which the to-be-tested products tested on the same test fixture are located is acquired.

In S102, target testing station information of the to-be-tested products is acquired according to the identity information of the to-be-tested products.

In S103, the target testing station information is compared with the identity information of the current testing station to generate a comparison result. According to the comparison result, the testing flow of the current testing station is executed, or testing prompt information is output.

Figure 5:
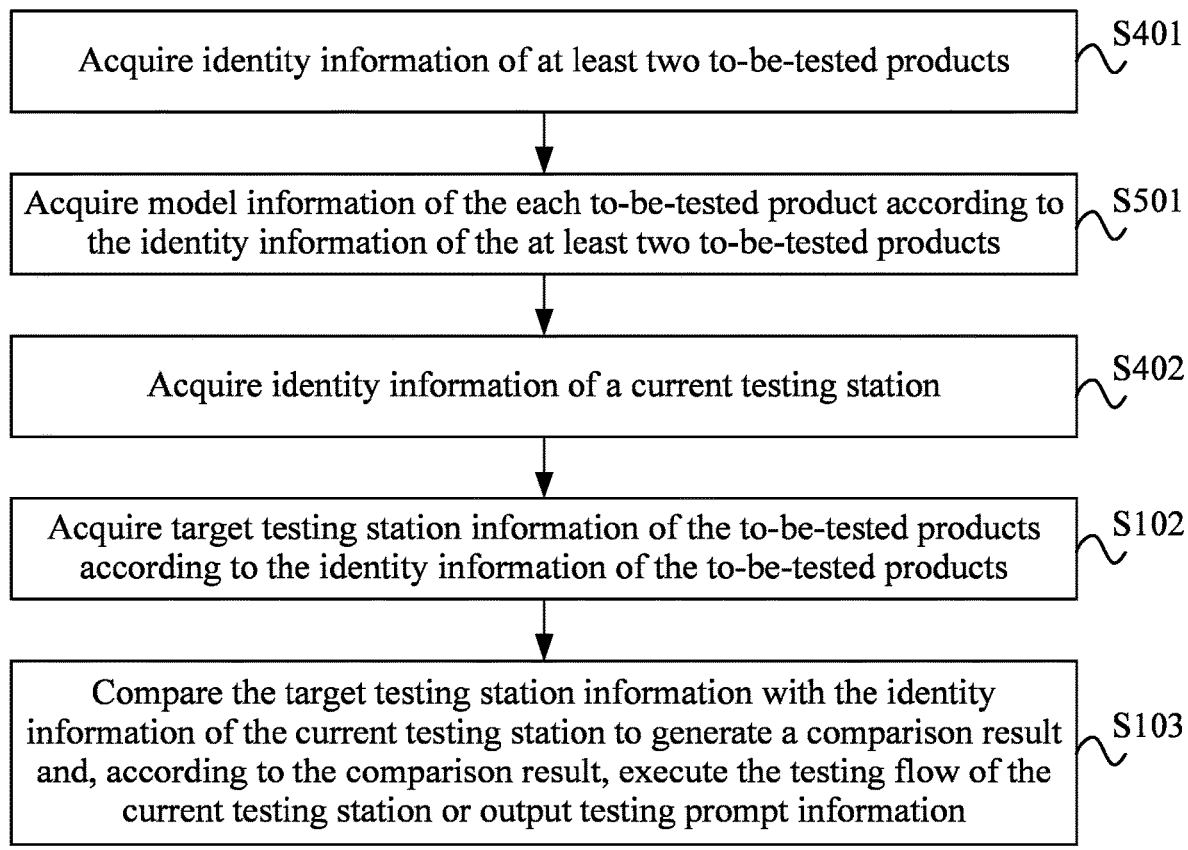
FIG. 5 is a flowchart of another product line testing method according to an embodiment of the present invention.

Optionally, FIG. 5 is a flowchart of another product line testing method according to an embodiment of the present invention. Referring to FIG. 5, the product line testing method provided in this embodiment of the present invention includes steps described below.

In S401, identity information of at least two to-be-tested products is acquired.

In S501, model information of the each to-be-tested product is acquired according to the identity information of the at least two to-be-tested products.

In S402, the identity information of the current testing station is acquired.

In S102, target testing station information of the to-be-tested products is acquired according to the identity information of the to-be-tested products.

In S103, the target testing station information is compared with the identity information of the current testing station to generate a comparison result. According to the comparison result, the testing flow of the current testing station is executed, or testing prompt information is output.

Specifically, when the target testing station information matches the identity information of the current testing station, it is determined that the to-be-tested product is allowed to be tested at the current testing station, and the to-be-tested product is tested at the current testing station. In this manner, it is convenient to improve the testing efficiency and reduce waste of labor cost. When the target testing station information does not match the identity information of the current testing station, it is determined that the to-be-tested product is not allowed to be tested at the current testing station. The testing prompt information of the target testing station is output to prompt the testing station for the to-be-tested product to be tested.

Figure 6:
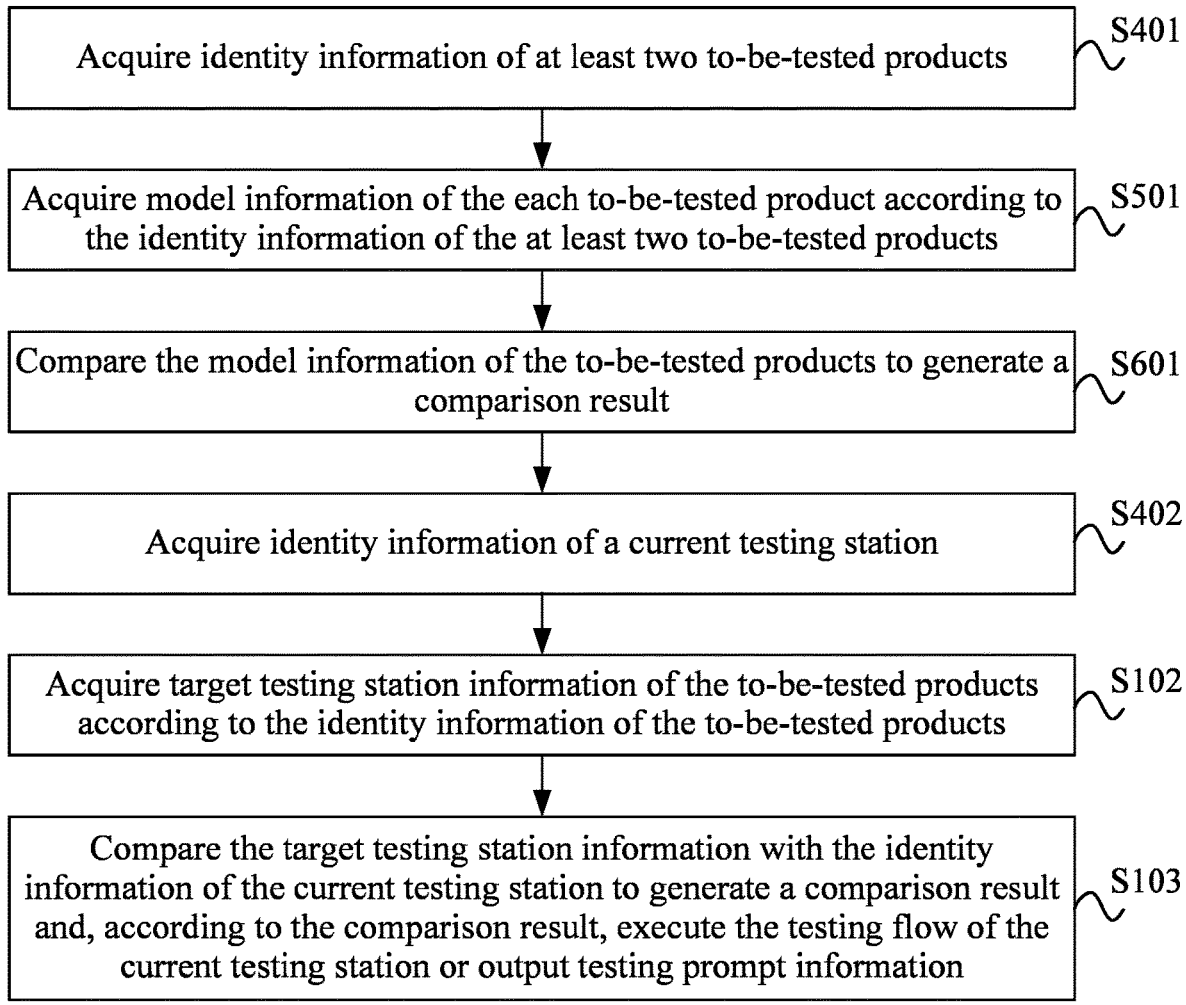
FIG. 6 is a flowchart of another product line testing method according to an embodiment of the present invention.

Optionally, FIG. 6 is a flowchart of another product line testing method according to an embodiment of the present invention. Referring to FIG. 6, the product line testing method provided in this embodiment of the present invention includes steps described below.

In S401, identity information of at least two to-be-tested products is acquired.

In S501, model information of the each to-be-tested product is acquired according to the identity information of the at least two to-be-tested products.

Specifically, the relevant information of the to-be-tested products is acquired from a cloud server according to the identity information of the at least two to-be-tested products, including product model information, product testing records, testing results, target testing station information, pointers, and the like.

In S601, the model information of the to-be-tested products is compared to generate a comparison result.

Specifically, the model information of to-be-tested products which are tested on the same test fixture is compared. It is determined that the model information of the to-be-tested products which are tested on the same test fixture is consistent.

In an optional embodiment, the comparison result includes that the model information of each to-be-tested product is the same or the model information of each to-be-tested product is different. Optionally, the model information of the each to-be-tested product is compared to generate the comparison result, including determining that the model information of the each to-be-tested product is the same when the model information of the each to-be-tested product matches and determining that the model information of each to-be-tested product is different when the model information of the each to-be-tested product does not match.

In S402, the identity information of the current testing station is acquired.

In S102, target testing station information of the to-be-tested products is acquired according to the identity information of the to-be-tested products.

In S103, the target testing station information is compared with the identity information of the current testing station to generate a comparison result. According to the comparison result, the testing flow of the current testing station is executed, or testing prompt information is output.

Figure 7:
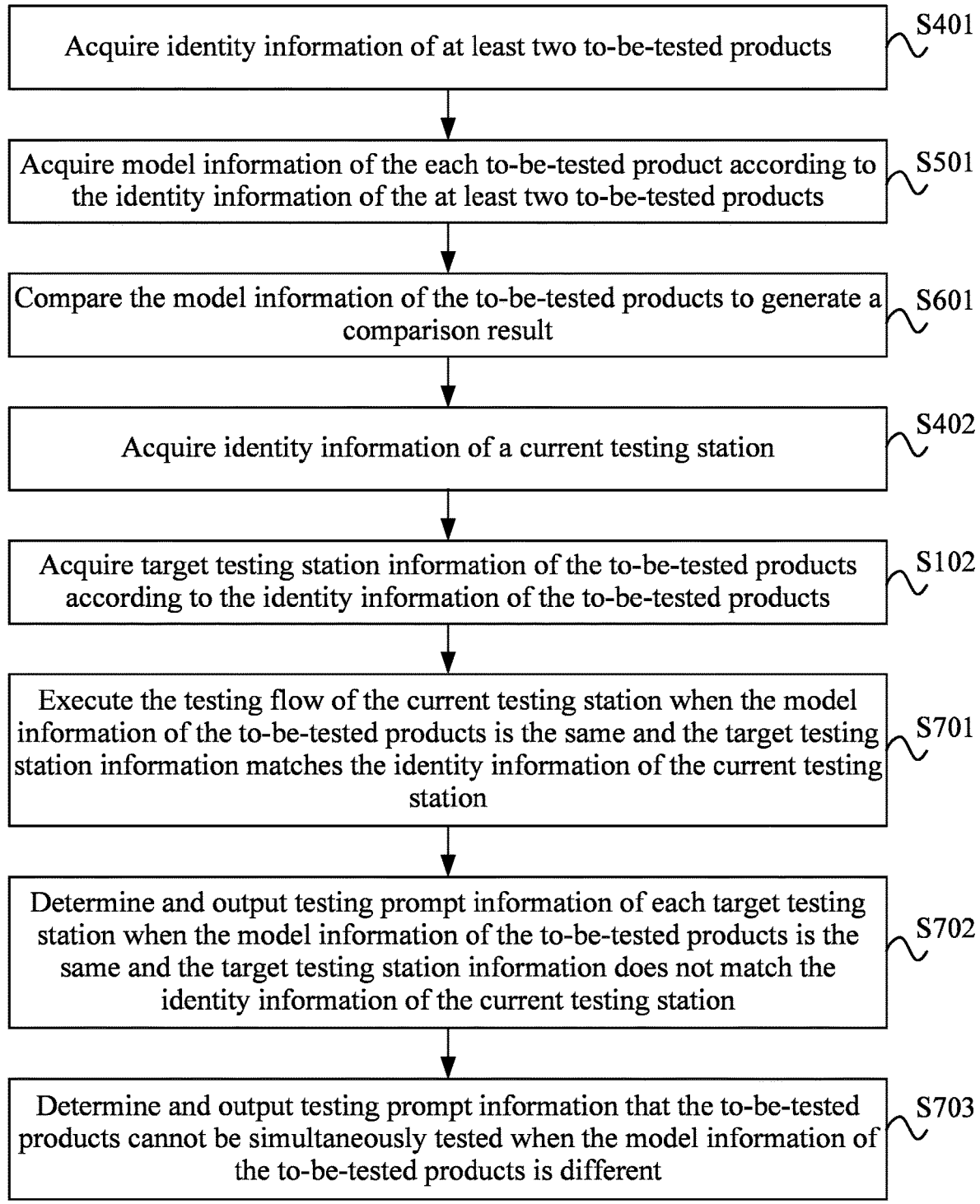
FIG. 7 is a flowchart of another product line testing method according to an embodiment of the present invention.

Optionally, FIG. 7 is a flowchart of another product line testing method according to an embodiment of the present invention. Referring to FIG. 7, the product line testing method provided in this embodiment of the present invention includes steps described below.

In S401, identity information of at least two to-be-tested products is acquired.

In S501, model information of the each to-be-tested product is acquired according to the identity information of the at least two to-be-tested products.

In S601, the model information of the to-be-tested products is compared to generate a comparison result.

In S402, identity information of a current testing station is acquired.

In S102, target testing station information of the to-be-tested products is acquired according to the identity information of the to-be-tested products.

In S701, when the model information of the to-be-tested products is the same and the target testing station information matches the identity information of the current testing station, the testing flow of the current testing station is executed.

Specifically, when the model information of each to-be-tested product is the same and the target testing station information matches the identity information of the current testing station, it is determined that the each to-be-tested product with the same model information is allowed to be tested at the current testing station. Exemplarily, multiple to-be-tested products are loaded on the same test fixture. The models of the multiple to-be-tested products loaded on the same test fixture are the same. For example, the target testing station information is testing station A. When the identity information of the current testing station is testing station A, the target testing station information matches the identity information of the current testing station. The testing flow of the current testing station, that is, testing station A, is executed to test the multiple to-be-tested products loaded on the same test fixture. The multiple to-be-tested products need to pass from testing station A to testing station B, from testing station B to testing station C, and from testing station C to testing station D, . . . . In this manner, the to-be-tested products can be tested efficiently.

In S702, when the model information of the to-be-tested products is the same and the target testing station information does not match the identity information of the current testing station, testing prompt information of each target testing station is determined and output.

Specifically, when the model information of each to-be-tested product is the same and the target testing station information does not match the identity information of the current testing station, the testing prompt information of the target testing station of the each to-be-tested product is determined and output. In this manner, the testing prompt information of the target testing station of each to-be-tested product output from a central controller can be sent to a test subsystem.

Exemplarily, multiple to-be-tested products are loaded on the same test fixture. The models of the multiple to-be-tested products loaded on the same test fixture are the same. For example, the target testing station information is testing station B. When the identity information of the current testing station is testing station A, the target testing station information does not match the identity information of the current testing station. The testing prompt information of the target testing station B is determined and output. The multiple to-be-tested products need to pass from testing station A to testing station B, from testing station B to testing station C, and from testing station C to testing station D, . . . .

In S703, when the model information of the to-be-tested products is different, testing prompt information that the to-be-tested products cannot be simultaneously tested is determined and output.

Specifically, when the model information of the to-be-tested products is different, for example, each test fixture can simultaneously test four mainboards. Four mainboards are placed on the same test fixture. If the model information of one of the four mainboards is different from the model information of the other three mainboards, it is determined that the to-be-tested products cannot be simultaneously tested. The testing prompt information that the to-be-tested products cannot be simultaneously tested is output.

Exemplarily, multiple to-be-tested products are loaded on the same test fixture. The models of the multiple to-be-tested products loaded on the same test fixture are different. For example, models of one or more to-be-tested products are different from models of other to-be-tested products. The testing prompt information that the to-be-tested products cannot be simultaneously tested is determined and output.

Figure 8:
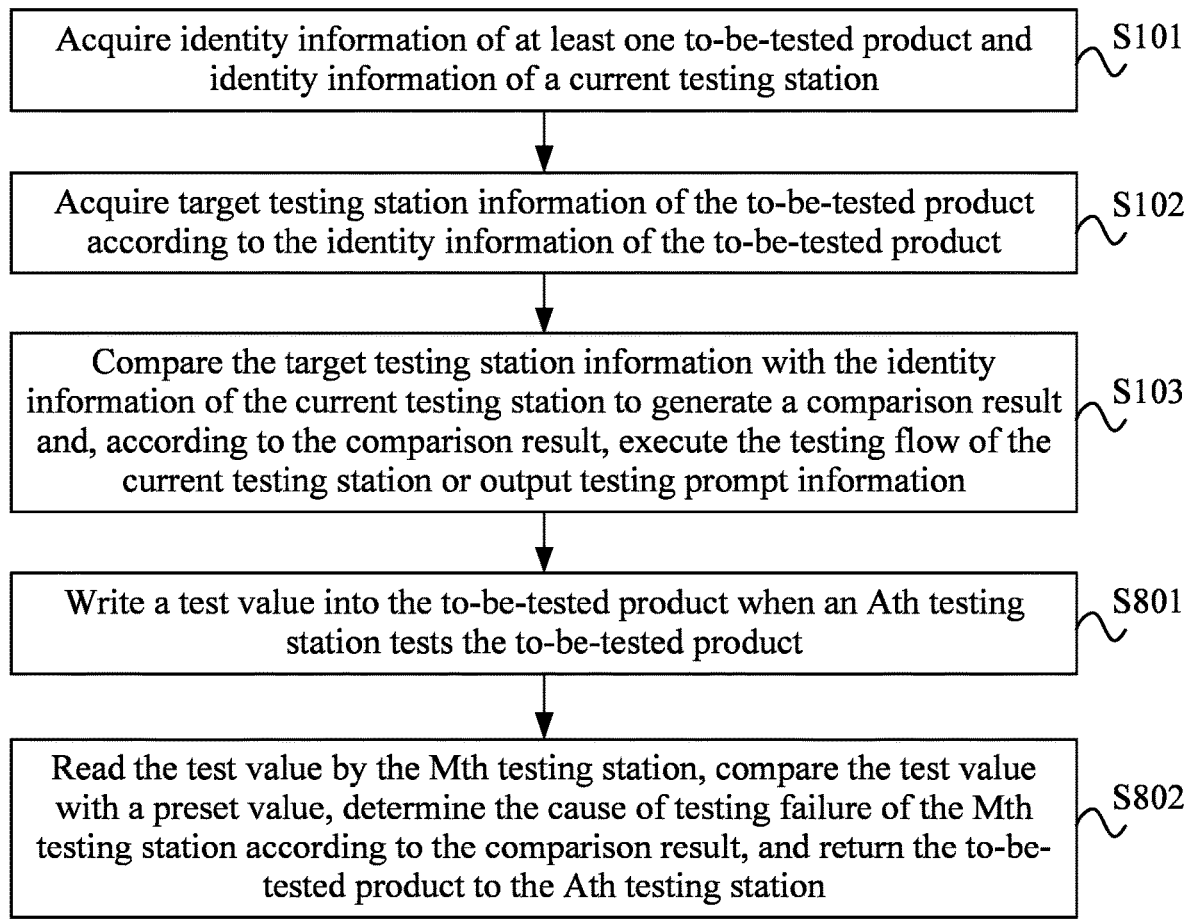
FIG. 8 is a flowchart of another product line testing method according to an embodiment of the present invention.

Optionally, FIG. 8 is a flowchart of another product line testing method according to an embodiment of the present invention. Referring to FIG. 8, the product line testing method provided in this embodiment of the present invention includes steps described below.

In S101, identity information of at least one to-be-tested product and identity information of a current testing station are acquired.

In S102, target testing station information of the to-be-tested product is acquired according to the identity information of the to-be-tested product.

In S103, the target testing station information is compared with the identity information of the current testing station to generate a comparison result. According to the comparison result, the testing flow of the current testing station is executed, or testing prompt information is output.

In S801, a test value is written into the to-be-tested product when an Ath testing station tests the to-be-tested product.

Specifically, a test value is written into the to-be-tested product when the Ath testing station tests the to-be-tested product. The test value is the test value to be used by an Mth testing station. The Mth testing station may be a Bth testing station, a Cth testing station, a Dth testing station, or the like. It is to be noted that a test value may be written into the to-be-tested product when the Bth testing station tests the to-be-tested product, and no limitation is given herein.

In S802, the Mth testing station reads the test value. The test value is compared with a preset value. The cause of testing failure of the Mth testing station is determined according to the comparison result. The to-be-tested product is returned to the Ath testing station.

Specifically, when a testing error occurs at the Mth testing station, it can be determined that the cause for the testing error at the Mth testing station is the deviation of the test value written by the Ath station according to the deviation between the test value and the preset value. The cause of the testing failure of the Mth testing station may be determined according to the comparison result. The to-be-tested product is returned to the Ath testing station and tested again.

Figure 9:
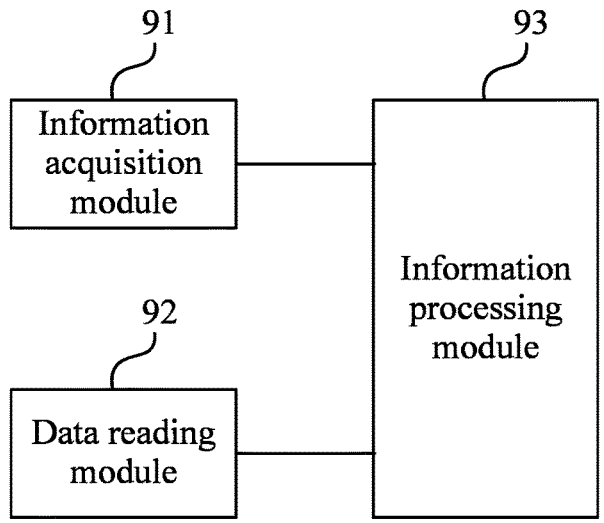
FIG. 9 is a diagram illustrating the structure of a product line testing system according to an embodiment of the present invention.

Optionally, FIG. 9 is a diagram illustrating the structure of a product line testing system according to an embodiment of the present invention. Referring to FIG. 9, the product line testing system provided in this embodiment of the present invention is configured to execute the product line testing method proposed in any of the preceding embodiments. The product line testing system provided in this embodiment of the present invention includes an information acquisition module 91, a data reading module 92, and an information processing module 93.

The information acquisition module 91 is configured to acquire identity information of at least one to-be-tested product and identity information of a current testing station. The information acquisition module 91 may include, for example, a scanning gun.

The data reading module 92 is configured to acquire target testing station information of the to-be-tested product according to the identity information of the to-be-tested product. The data reading module 92 may use the same apparatus or a different apparatus as the information acquisition module 91.

The information processing module 93 is configured to compare the target testing station information with the identity information of the current testing station to generate a comparison result and, according to the comparison result, execute the testing flow of the current testing station or output testing prompt information. According to the comparison result, executing the testing flow of the current testing station includes determining, according to the comparison result, whether to perform testing at the current testing station; executing the testing flow of the current testing station if the testing is performed at the current testing station; and updating target testing station information of the to-be-tested product when the testing is finished at the current testing station; and when the to-be-tested product enters a next testing station to test, taking the updated target testing station information as the target testing station information.

According to the product line testing system provided in this embodiment of the present invention, the information acquisition module acquires the identity information of the at least one to-be-tested product and the identity information of the current testing station. The data reading module acquires the target testing station information of the to-be-tested product according to the identity information of the to-be-tested product. Further, the information processing module compares the target testing station information with the identity information of the current testing station to generate a comparison result and, according to the comparison result, executes the testing flow of the current testing station or outputs testing prompt information. Optionally, according to the comparison result, the testing flow of the current testing station may be executed to test the to-be-tested product. In this manner, the testing time caused by problems of different stations in the product testing flow is saved, the testing efficiency in the testing flow is improved, and the labor cost of the testing returning is reduced.

It is to be understood that various forms of the preceding flows may be used with steps reordered, added, or removed. For example, the steps described in the present invention may be executed in parallel, in sequence, or in a different order as long as the desired results of the technical solutions in the present invention are implemented.

Exemplarily, the product line testing system may include a processor, and a storage device for storing computer executable instructions that when executed by the processor cause the processor to perform:

acquiring identity information of at least one to-be-tested product and identity information of a current testing station;

acquiring target testing station information of the at least one to-be-tested product according to the identity information of the at least one to-be-tested product; and comparing the target testing station information with the identity information of the current testing station to generate a comparison result and, according to the comparison result, executing a testing flow of the current testing station or outputting testing prompt information, wherein according to the comparison result, executing the testing flow of the current testing station includes:

determining, according to the comparison result, whether to perform testing at the current testing station; executing the testing flow of the current testing station if the testing is performed at the current testing station; and updating target testing station information of the at least one to-be-tested product when the testing is finished at the current testing station; and when the at least one to-be-tested product enters a next testing station to test, taking updated target testing station information as the target testing station information.

According to embodiments of the present disclosure, the product line testing method described above may be implemented as a computer software program. For example, the embodiments of the present disclosure include a computer program product. The computer program product includes a computer program carried in a non-transitory computer-readable medium. The computer program includes computer instructions for causing a computer to perform:

acquiring identity information of at least one to-be-tested product and identity information of a current testing station;

acquiring target testing station information of the at least one to-be-tested product according to the identity information of the at least one to-be-tested product; and comparing the target testing station information with the identity information of the current testing station to generate a comparison result and, according to the comparison result, executing a testing flow of the current testing station or outputting testing prompt information, wherein according to the comparison result, executing the testing flow of the current testing station includes:

determining, according to the comparison result, whether to perform testing at the current testing station; executing the testing flow of the current testing station if the testing is performed at the current testing station; and updating target testing station information of the at least one to-be-tested product when the testing is finished at the current testing station; and when the at least one to-be-tested product enters a next testing station to test, taking updated target testing station information as the target testing station information.

It is to be noted that the computer-readable medium described above in the present disclosure may be a computer-readable signal medium or a computer-readable storage medium or any combination thereof. The computer-readable storage medium may be, but not limited to, an electronic, magnetic, optical, electromagnetic, infrared or semiconductor system, apparatus or device, or any combination thereof. The computer-readable storage medium may include, but is not limited to, an electrical connection having one or more wires, a portable computer magnetic disk, a hard disk, an RAM, an ROM, an erasable programmable (EPROM) or a flash memory, an optical fiber, a portable compact disc read-only memory (CD-ROM), an optical storage device, a magnetic storage device, or any suitable combination thereof. In the present disclosure, the computer-readable storage medium may be any tangible medium including or storing a program. The program may be used by or used in conjunction with an instruction execution system, apparatus, or device. In the present disclosure, the computer-readable signal medium may include a data signal propagated on a baseband or as a part of a carrier, and computer-readable program codes are carried in the data signal. This propagated data signal may take a plurality of forms including, but being not limited to, an electromagnetic signal, an optical signal, or any suitable combination thereof. The computer-readable signal medium may further be any computer-readable medium other than the computer-readable storage medium. The computer-readable signal medium may send, propagate, or transmit a program used by or in conjunction with an instruction execution system, apparatus, or device. The program codes included in the computer-readable medium may be transmitted in any suitable medium, including, but being not limited to, a wire, an optical cable, a Radio Frequency (RF), or any suitable combination thereof.

According to the technical solutions of the embodiments of the present invention, the identity information of the at least one to-be-tested product and the identity information of the current testing station are acquired; the target testing station information of the at least one to-be-tested product is acquired according to the identity information of the at least one to-be-tested product; and the target testing station information is compared with the identity information of the current testing station to generate a comparison result and, according to the comparison result, the testing flow of the current testing station is executed or testing prompt information is output. By outputting the testing prompt information, it is convenient to monitor the test status of the test fixture in real time and improve the testing efficiency of the to-be-tested product.

What is claimed is:

1. A product line testing method, comprising:

acquiring identity information of at least one to-be-tested product and identity information of a current testing station;

acquiring target testing station information of the at least one to-be-tested product according to the identity information of the at least one to-be-tested product; and comparing the target testing station information with the identity information of the current testing station to generate a comparison result, and, according to the comparison result, executing a testing flow of the current testing station or outputting testing prompt information, wherein according to the comparison result, executing the testing flow of the current testing station comprises:

determining, according to the comparison result, whether to perform testing at the current testing station; executing the testing flow of the current testing station if the testing is performed at the current testing station; and updating the target testing station information of the at least one to-be-tested product when the testing is finished at the current testing station; and when the at least one to-be-tested product enters a next testing station to test, taking the updated target testing station information as the target testing station information;

wherein acquiring the identity information of the at least one to-be-tested product and the identity information of the current testing station comprises:

acquiring identity information of at least two to-be-tested products; and acquiring the identity information of the current testing station;

after acquiring the identity information of the at least two to-be-tested products, the duct line testing method further comprises:

acquiring model information of each of the at least two to-be-tested products according to the identity information of the at least two to-be-tested products;

after acquiring the model information of the each of the at least to-be-tested products according to the identity information of the at least two to-be-tested products, the product line testing method further comprises:

comparing the model information of the at least two to-be-tested products to generate a comparison result, wherein the comparison result comprises:
the model information of the at least two to-be-tested products being same or different;
wherein according to the comparison result, executing the testing flow of the current testing station or outputting testing prompt information comprises:
when the model information of the at least two to-be-tested products is same and the target testing station information matches the identity information of the current testing station, executing the testing flow of the current testing station;
when the model information of the at least two to-be-tested products is same and the target testing station information does not match the identity information of the current testing station, determining and outputting testing prompt information of each target testing station; and
when the model information of the at least two to-be-tested products is different, determining and outputting testing prompt information that the at least two to-be-tested products cannot be simultaneously tested.

2. The product line testing method of claim 1, wherein executing the testing flow of the current testing station comprises:
sending a testing request, performing a testing operation according to the testing request, acquiring a testing result, and updating the target testing station information.

3. The product line testing method of claim 2, wherein performing the testing operation according to the testing request comprises:
controlling a test fixture to press down so that the test fixture acts on the at least one to-be-tested product; and
executing a testing program on the at least one to-be-tested product.

4. The product line testing method of claim 1, after according to the comparison result, executing the testing flow of the current testing station, further comprising:
writing a test value into the at least two to-be-tested products when an Ath testing station tests the at least two to-be-tested products; and
reading the test value by an Mth testing station, comparing the test value with a preset value, determining a cause of testing failure of the Mth testing station according to a comparison result, and returning the at least two to-be-tested products to the Ath testing station.

5. A product line testing system, comprising a processor, and a storage device for storing computer executable instructions that when executed by the processor cause the processor to perform:
acquiring identity information of at least one to-be-tested product and identity information of a current testing station;
acquiring target testing station information of the at least one to-be-tested product according to the identity information of the at least one to-be-tested product; and
comparing the target testing station information with the identity information of the current testing station to generate a comparison result, and, according to the comparison result, executing a testing flow of the current testing station or outputting testing prompt information,
wherein according to the comparison result, executing the testing flow of the current testing station comprises:
determining, according to the comparison result, whether to perform testing at the current testing station; executing the testing flow of the current testing station if the testing is performed at the current testing station; and updating the target testing station information of the at least one to-be-tested product when the testing is finished at the current testing station; and
when the at least one to-be-tested product enters a next testing station to test, taking the updated target testing station information as the target testing station information;
wherein acquiring the identity information of the at least one to-be-tested product and the identity information of the current testing station comprises:
acquiring identity information of at least two to-be-tested products; and
acquiring the identity information of the current testing station;
after acquiring the identity information of the at least two to-be-tested products, the duct line testing method further comprises:
acquiring model information of each of the at least two to-be-test products according to the identity information of the at least two to-be-tested products;
after acquiring the model information of the each of the at least to-be-tested products according to the identity information of the at least two to-be-tested products, the product line testing method further comprises:
comparing the model information of the at least two to-be-tested products to generate a comparison result, wherein the comparison result comprises:
the model information of the at least two to-be-tested products being same or different;
wherein according to the comparison result, executing the testing flow of the current testing station or outputting testing prompt information comprises:
when the model information of the at least two to-be-tested products is same and the target testing station information matches the identity information of the current testing station, executing the testing flow of the current testing station;
when the model information of the at least two to-be-tested products is same and the target testing station information does not match the identity information of the current testing station, determining and outputting testing prompt information of each target testing station; and
when the model information of the at least two to-be-tested products is different, determining and outputting testing prompt information that the at least two to-be-tested products cannot be simultaneously tested.

6. The product line testing system of claim 5, wherein executing the testing flow of the current testing station comprises:
sending a testing request, performing a testing operation according to the testing request, acquiring a testing result, and updating the target testing station information.

7. The product line testing system of claim 6, wherein performing the testing operation according to the testing request comprises:
controlling a test fixture to press down so that the test fixture acts on the at least one to-be-tested product; and
executing a testing program on the at least one to-be-tested product.

8. The product line testing system of claim 5, after according to the comparison result, executing the testing flow of the current testing station, the product line testing method further comprises:

writing a test value into the at least two to-be-tested products when an Ath testing station tests the at least two to-be-tested products; and reading the test value by an Mth testing station, comparing the test value with a preset value, determining a cause of testing failure of the Mth testing station according to a comparison result, and returning the at least two to-be-tested products to the Ath testing station.

9. A non-transitory computer-readable storage medium storing computer instructions for causing a computer to perform:

acquiring identity information of at least one to-be-tested product and identity information of a current testing station;

acquiring target testing station information of the at least one to-be-tested product according to the identity information of the at least one to-be-tested product; and comparing the target testing station information with the identity information of the current testing station to generate a comparison result, and, according to the comparison result, executing a testing flow of the current testing station or outputting testing prompt information, wherein according to the comparison result, executing the testing flow of the current testing station comprises:

determining, according to the comparison result, whether to perform testing at the current testing station; executing the testing flow of the current testing station if the testing is performed at the current testing station; and updating the target testing station information of the at least one to-be-tested product when the testing is finished at the current testing station; and when the at least one to-be-tested product enters a next testing station to test, taking the updated target testing station information as the target testing station information;

wherein acquiring the identity information of the at least one to-be-tested product and the identity information of the current testing station comprises:

acquiring identity information of at least two to-be-tested products; and acquiring the identity information of the current testing station;

after acquiring the identity information of the at least two to-be-tested products, the duct line testing method further comprises:

acquiring model information of each of the at least two to-be-test products according to the identity information of the at least two to-be-tested products;

after acquiring the model information of the each of the at least to-be-tested products according to the identity information of the at least two to-be-tested products, the product line testing method further comprises:

comparing the model information of the at least two to-be-tested products to generate a comparison result, wherein the comparison result comprises:

the model information of the at least two to-be-tested products being same or different;

wherein according to the comparison result, executing the testing flow of the current testing station or outputting testing prompt information comprises:

when the model information of the at least two to-be-tested products is same and the target testing station information matches the identity information of the current testing station, executing the testing flow of the current testing station;

when the model information of the at least two to-be-tested products is same and the target testing station information does not match the identity information of the current testing station, determining and outputting testing prompt information of each target testing station; and when the model information of the at least two to-be-tested products is different, determining and outputting testing prompt information that the at least two to-be-tested products cannot be simultaneously tested.

10. The non-transitory computer-readable storage medium of claim 9, wherein executing the testing flow of the current testing station comprises:

sending a testing request, performing a testing operation according to the testing request, acquiring a testing result, and updating the target testing station information.

* * * * *